(12) United States Patent
Zhang et al.

(10) Patent No.: US 11,348,987 B2
(45) Date of Patent: May 31, 2022

(54) OLED DISPLAY SUBSTRATE HAVING LARGE APERTURE RATIO, METHOD OF MANUFACTURING THE SAME, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinling Zhang, Beijing (CN); Fei Deng, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 229 days.

(21) Appl. No.: 16/611,717

(22) PCT Filed: May 14, 2019

(86) PCT No.: PCT/CN2019/086780
§ 371 (c)(1),
(2) Date: Nov. 7, 2019

(87) PCT Pub. No.: WO2019/218993
PCT Pub. Date: Nov. 21, 2019

(65) Prior Publication Data
US 2021/0335956 A1    Oct. 28, 2021

(30) Foreign Application Priority Data

May 16, 2018    (CN) .......................... 201810469781.7

(51) Int. Cl.
*H01L 29/08*    (2006.01)
*H01L 27/32*    (2006.01)
(Continued)

(52) U.S. Cl.
CPC ...... *H01L 27/3265* (2013.01); *H01L 51/5206* (2013.01); *H01L 51/56* (2013.01); *H01L 27/3272* (2013.01); *H01L 2227/323* (2013.01)

(58) Field of Classification Search
CPC ............. H01L 27/3265; H01L 27/3272; H01L 51/5206; H01L 2227/323
(Continued)

(56) References Cited

U.S. PATENT DOCUMENTS

| 9,589,995 B2 | 3/2017 | Shi et al. |
| 2004/0048475 A1* | 3/2004 | Hong ................ H01L 21/76897 |
| | | 438/689 |

(Continued)

FOREIGN PATENT DOCUMENTS

| CN | 101135822 A | 3/2008 |
| CN | 102208406 B | 7/2013 |

(Continued)

OTHER PUBLICATIONS

International Search Report and Written Opinion for Application No. PCT/CN2019/086780, dated Aug. 12, 2019, 12 Pages.
(Continued)

*Primary Examiner* — Phuc T Dang
(74) *Attorney, Agent, or Firm* — Brooks Kushman P.C.

(57) ABSTRACT

An OLED display substrate, a method of manufacturing the OLED display substrate, and a display device are provided. The OLED display substrate includes a plurality of aperture regions arranged in an array on a base substrate; and a plurality of storage capacitors on the base substrate, an orthographic projection of each storage capacitor of the plurality of storage capacitors on the base substrate having an overlapping region with an orthographic projection of an aperture region corresponding to the storage capacitor in the plurality of aperture regions on the base substrate.

20 Claims, 3 Drawing Sheets

(51) Int. Cl.
  *H01L 51/52* (2006.01)
  *H01L 51/56* (2006.01)
(58) Field of Classification Search
  USPC .......................................................... 257/40
  See application file for complete search history.

(56) References Cited

U.S. PATENT DOCUMENTS

| | | | |
|---|---|---|---|
| 2008/0160712 A1* | 7/2008 | Park | H01L 28/56 438/381 |
| 2015/0055051 A1 | 2/2015 | Osawa et al. | |
| 2015/0115259 A1 | 4/2015 | Yamazaki et al. | |
| 2015/0214249 A1 | 7/2015 | Cheng et al. | |
| 2016/0247869 A1 | 8/2016 | Li et al. | |
| 2017/0092698 A1 | 3/2017 | Zou | |
| 2017/0269762 A1 | 9/2017 | Xu et al. | |

FOREIGN PATENT DOCUMENTS

| | | |
|---|---|---|
| CN | 106057821 A | 10/2016 |
| CN | 107316873 A | 11/2017 |
| CN | 108428730 A | 8/2018 |
| EP | 3724918 A1 | 10/2020 |
| JP | 2007109918 A | 4/2007 |
| WO | 2019114204 A1 | 6/2019 |

OTHER PUBLICATIONS

First Office Action for Indian Application No. 201927052124, dated May 3, 2021, 6 Pages (including English translation).
Extended European Search Report for EP Application No. 19804297.0-1230, dated Jan. 18, 2022, 9 Pages.

* cited by examiner

OLED DISPLAY SUBSTRATE HAVING LARGE APERTURE RATIO, METHOD OF MANUFACTURING THE SAME, AND DISPLAY DEVICE

CROSS-REFERENCE TO RELATED APPLICATIONS

This application is the U.S. national phase of PCT Application No. PCT/CN2019/086780 filed on May 14, 2019, which claims priority to Chinese Patent Application No. 201810469781.7 filed on May 16, 2018, which are incorporated herein by reference in their entireties.

TECHNICAL FIELD

The present disclosure relates to the field of display technology, and in particular, relates to an OLED display substrate, a method of manufacturing the OLED display substrate, and a display device.

BACKGROUND

An Active-Matrix Organic Light Emitting Diode (AMO-LED) display has a wide market application. In the related art, a bottom-emission type Organic Light Emitting Diode (OLED) display device is mainly used for a large-size display, such as an OLED television. However, a large-size OLED display has a problem of a low aperture ratio.

SUMMARY

An OLED display substrate, a method of manufacturing the OLED display substrate, and a display device are provided.

In a first aspect, an Organic Light Emitting Diode (OLED) display substrate is provided. The OLED display substrate includes a plurality of aperture regions arranged in an array on a base substrate; and a plurality of storage capacitors on the base substrate, wherein an orthographic projection of each storage capacitor of the plurality of storage capacitors on the base substrate has an overlapping region with an orthographic projection of an aperture region corresponding to the storage capacitor in the plurality of aperture regions on the base substrate.

Optionally, a light transmittance of each of the plurality of storage capacitors is greater than a preset threshold value, the orthographic projection of the each of the plurality of storage capacitors on the base substrate is within the orthographic projection of the aperture region corresponding to the storage capacitor on the base substrate.

Optionally, the storage capacitor includes a first capacitor electrode, a first insulating layer on the first capacitor electrode, a second capacitor electrode on the first insulating layer, a second insulating layer on the second capacitor electrode, and a third capacitor electrode on the second insulating layer, and the third capacitor electrode is electrically connected to the first capacitor electrode.

Optionally, the first capacitor electrode is an electrically-conductive active layer; the second capacitor electrode is a transparent electrode; the third capacitor electrode is an anode of the OLED display substrate.

Optionally, the transparent electrode is made of one of ITO, graphene, and MoTi.

Optionally, the preset threshold value is 80% or more.

Optionally, the first insulating layer is an interlayer insulating layer, and the second insulating layer is a passivation layer.

Optionally, the OLED display substrate further includes a gate insulating layer, a gate electrode, and a gate line between the first capacitor electrode and the first insulating layer.

Optionally, the OLED display substrate further includes: a source electrode, a drain electrode, and a data line in a same layer as the second capacitor electrode.

Optionally, the OLED display substrate further includes a light-shielding metal layer at a side of the first capacitor electrode facing towards the base substrate; and a buffer layer between the light-shielding metal layer and the first capacitor electrode.

In a second aspect, a display device is provided. The display device includes the OLED display substrate according to the first aspect.

In a third aspect, a method of manufacturing an OLED display substrate is provided, wherein the OLED display substrate includes a plurality of aperture regions arranged in an array on a base substrate. The method includes: manufacturing a plurality of storage capacitors on the base substrate, an orthographic projection of each of the plurality of storage capacitors on the base substrate having an overlapping region with an orthographic projection of an aperture region corresponding to the storage capacitor in the plurality of aperture regions on the base substrate.

Optionally, manufacturing the plurality of storage capacitors on the base substrate, the orthographic projection of each of the plurality of storage capacitors on the base substrate having the overlapping region with the orthographic projection of the aperture region corresponding to the storage capacitor in the plurality of aperture regions on the base substrate, includes: manufacturing the storage capacitor on the base substrate, the storage capacitor having a light transmittance greater than a preset threshold, the orthographic projection of the storage capacitor on the base substrate being within the orthographic projection of the aperture region on the base substrate.

Optionally, manufacturing the storage capacitor on the base substrate, includes manufacturing a first capacitor electrode on the base substrate; manufacturing a first insulating layer on the first capacitor electrode; manufacturing a second capacitor electrode on the first insulating layer; manufacturing a second insulating layer on the second capacitor electrode; manufacturing a third capacitor electrode on the second insulating layer, wherein the third capacitor electrode is electrically connected to the first capacitor electrode.

Optionally, manufacturing the first capacitor electrode includes manufacturing the first capacitor electrode by using an electrically-conductive active layer; manufacturing the second capacitor electrode includes manufacturing the second capacitor electrode by using a transparent electrically-conductive material; manufacturing the third capacitor electrode includes using an anode of the OLED display substrate as the third capacitor electrode.

Optionally, the transparent electrode is made of one of ITO, graphene, and MoTi.

Optionally, the preset threshold value is 80% or more.

Optionally, manufacturing a first insulating layer on the first capacitor electrode includes: manufacturing an interlayer insulating layer on the first capacitor electrode; manufacturing a second insulating layer on the second capacitor electrode includes: manufacturing a passivation layer on the second capacitor electrode.

Optionally, after manufacturing the first capacitor electrode on the base substrate, before manufacturing the first insulating layer on the first capacitor electrode, the method further includes manufacturing a gate insulating layer, a gate electrode, and a gate line on the first capacitor electrode.

Optionally, after manufacturing the second capacitor electrode on the first insulating layer, before manufacturing the second insulating layer on the second capacitor electrode, the method further includes: manufacturing a source electrode, a drain electrode, and a data line in a layer where the second capacitor electrode is in.

Optionally, before manufacturing the first capacitor electrode on the base substrate, the method further includes: manufacturing a light-shielding metal layer on the base substrate; and manufacturing a buffer layer on the light-shielding metal layer.

Optionally, after manufacturing the gate insulating layer, the gate electrode, and the gate line on the first capacitor electrode, manufacturing the first capacitor electrode by using the electrically-conductive active layer, includes: patterning the gate insulating layer to form a via-hole penetrating through the gate insulating layer; performing ion implantation to a portion of the active layer through the via-hole to form the electrically-conducted active layer as the first capacitor electrode, the portion of the active layer being a portion needing an electrically-conductive processing.

REFERENCE SIGNS

Figure 1:
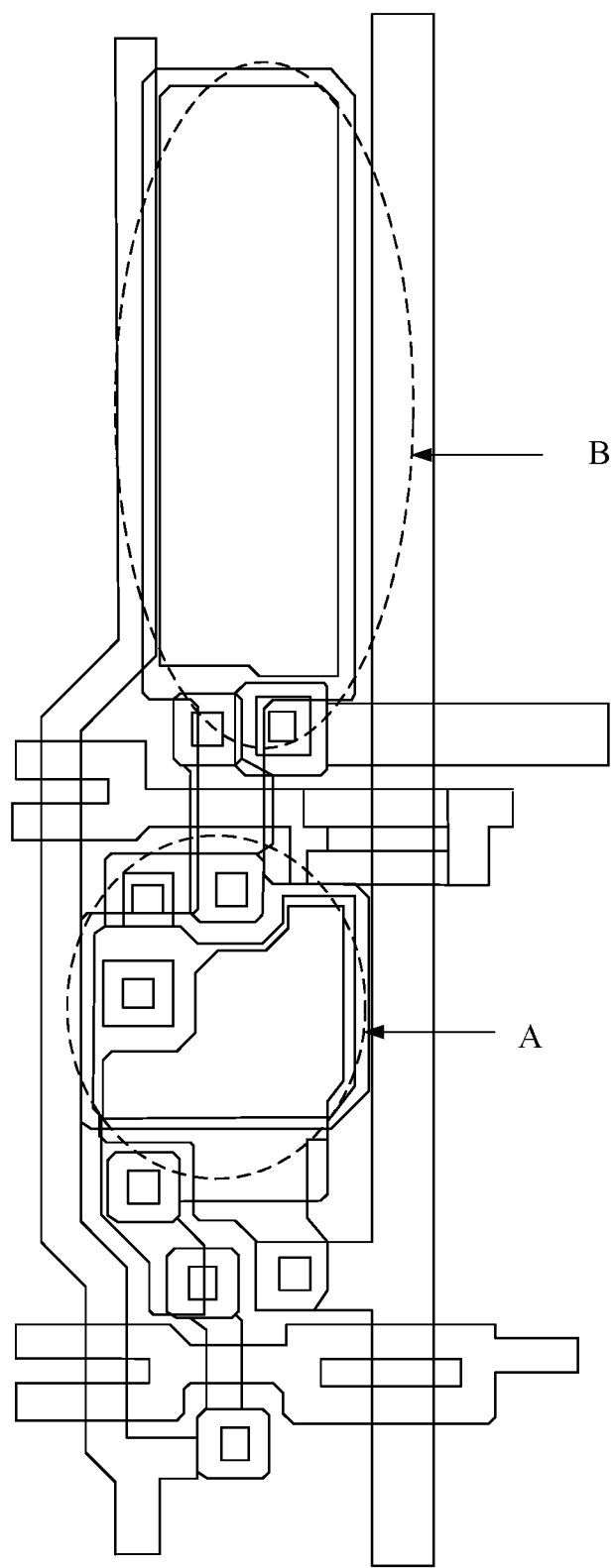
FIG. 1 is a schematic diagram of positional relationship between an aperture region and a storage capacitor in a related OLED display substrate.

A a storage capacitor
B an aperture region
21 a base substrate
22 a light-shielding metal layer
23 a buffer layer
24 a first capacitor electrode or an active layer
25 an interlayer insulating layer
26 a second capacitor electrode or a transparent electrode
27 a passivation layer
28 a third capacitor electrode or an anode

DETAILED DESCRIPTION

In order to make a technical problem, a technical solution and an advantage to be solved by the present disclosure more apparent, following detailed description will be made with reference to accompanying drawings and specific embodiments.

A related design of an OLED display substrate is that an aperture region and a storage capacitor are separated, and light cannot pass through a region where the storage capacitor is located, thereby reducing an aperture ratio of the OLED display substrate.

Figure 2:
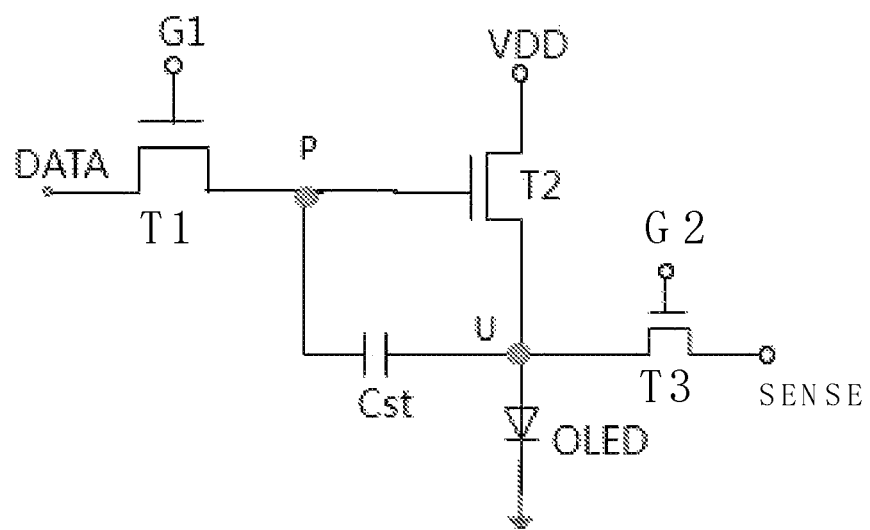
FIG. 2 is a schematic diagram of a pixel structure of a related OLED display substrate.

The aperture ratio of a related OLED display using a 3T1C pixel structure is approximately between 20% and 30%. FIG. 1 is a schematic diagram of positional relationship between an aperture region and a storage capacitor of a related OLED display substrate. FIG. 2 is a schematic diagram of a pixel structure of a related OLED display substrate. It may be seen that, in the related OLED display substrate, the aperture region B and the storage capacitor A are designed separately, and light cannot pass through the region where the storage capacitor is located, thereby reducing the aperture ratio of the OLED display substrate. Moreover, since the pixel structure is concentrated at a narrow space of a pixel, it is easy to cause electrical failure in a backplate manufacturing process, which is one of reasons why a product yield in production of an OLED display substrate is difficult to be improved.

In view of the above problems, some embodiments of the present disclosure provide an OLED display substrate, a method of manufacturing the OLED display substrate, and a display device, so that the aperture ratio of the OLED display substrate may be improved.

Figure 3:
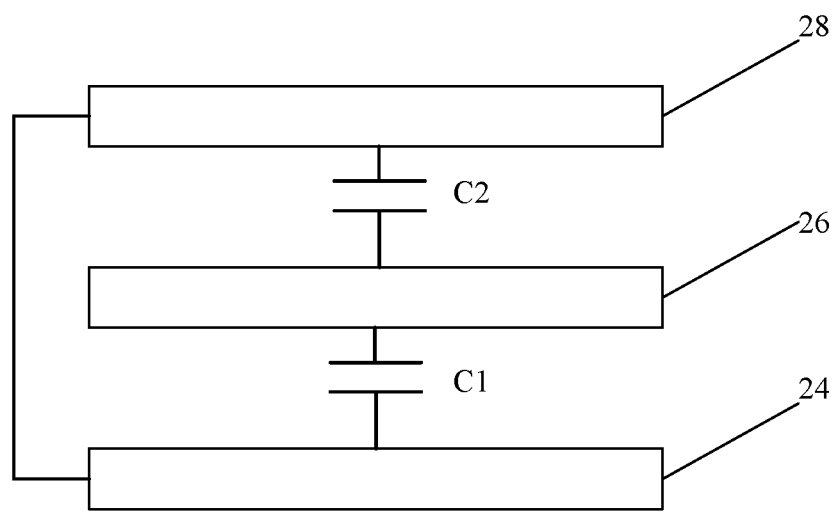
FIG. 3 is a schematic structural diagram of a storage capacitor of an OLED display substrate in the present disclosure.
Figure 4:
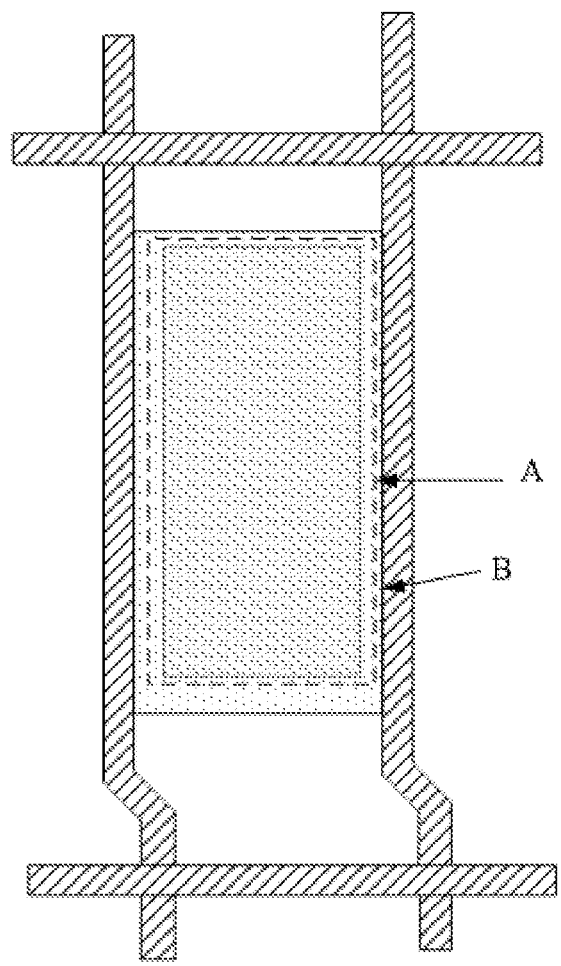
FIG. 4 is a schematic diagram of positional relationship between an aperture region and a storage capacitor in an OLED display substrate according to some embodiments of the present disclosure.
Figure 5:
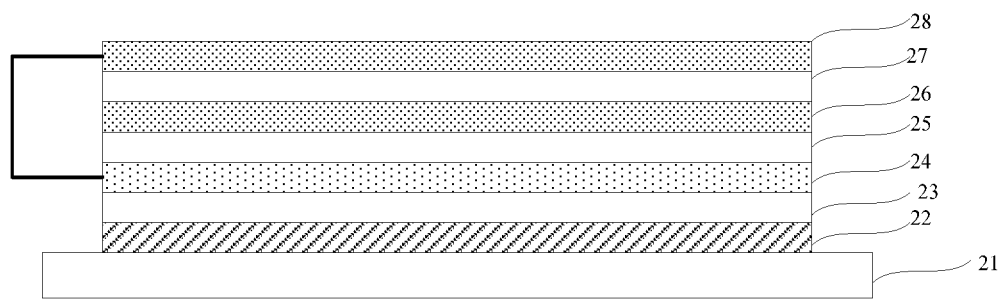
FIG. 5 is a specific schematic structural diagram of a storage capacitor inn OLED display substrate according to some embodiments of the present disclosure.

Some embodiments of the present disclosure provide an OLED display substrate. Referring to FIG. 3 to FIG. 5, the OLED display substrate includes a plurality of aperture regions B arranged in an array on a base substrate, and a plurality of storage capacitors A, wherein, an orthographic projection of each of the plurality of storage capacitors A on the base substrate 21 has an overlapping region with an orthographic projection of an aperture region corresponding to the storage capacitor in the plurality of aperture regions B on the base substrate 21.

Optionally, a light transmittance of each of the plurality of storage capacitors A is greater than a preset threshold value, for example, 80% or more, such as, 90%, 95%, etc.

In this example, the light transmittance of the storage capacitor is greater than the preset threshold value, and the orthographic projection of the storage capacitor on the base substrate and the orthographic projection of the aperture region on the base substrate are designed to have the overlapping region. In this way, an area of the storage capacitor may be increased, and an area of the aperture region of a pixel may be increased, too, so that the aperture ratio of the OLED display substrate may be improved. In addition, a space occupied by the pixel is increased, a line density is remarkably decreased, and the product yield is also improved.

An electrode of the storage capacitor may be made of a transparent conductive material. By selecting the material and a thickness of an electrode of the storage capacitor, the light transmittance of the storage capacitor may be more than 80%, so that the storage capacitor may be designed to be in the aperture region and an area of the aperture region of the pixel may be increased, thereby further increasing the aperture ratio of the OLED display substrate.

Optionally, as shown in FIG. 4, an orthographic projection of the storage capacitor A (a portion in a dashed box) on the base substrate falls within an orthographic projection of the aperture region B on the base substrate. In this way, the storage capacitor A does not occupy an area other than the aperture region B, so that the area of the aperture region may be maximized due to no requirement of an area used to accommodate the storage capacitor outside the aperture region.

In a specific example, referring to FIG. 3 and FIG. 5, the storage capacitor includes a first capacitor electrode 24, a first insulating layer 25 on the first capacitor electrode 24, a second capacitor electrode 26 on the first insulating layer 25, a second insulating layer 27 on the second capacitor electrode 26, and a third capacitor electrode 28 on the second insulating layer 27, wherein the third capacitor electrode 28 is electrically connected to the first capacitor electrode 24. The first capacitor electrode 24 and the second capacitor electrode 26 provide a first capacitor C1, the second capacitor electrode and the third capacitor electrode provide a second capacitor C2, and the two capacitors are electrically connected approximately in parallel (in parallel). Thus, a capacitance value of the storage capacitor is a sum of capacitance values of the two capacitors.

The first capacitor electrode 24 may be made of an electrically-conductive active layer; the second capacitor electrode 26 may be made of a transparent electrode; the third capacitor electrode 28 may be made of an anode of the OLED display substrate. In this example, the storage capacitor is formed of the transparent electrode, the electrically-conductive active layer and the anode by utilizing a characteristic of a high light transmittance of the transparent electrode, and the storage capacitor is used in the aperture region of the pixel, thereby both increasing the area of the aperture region of the pixel and increasing the area of the storage capacitor, and a capacitance of the formed storage capacitor is correspondingly increased. Meanwhile, since a pixel structure is greatly simplified, a line density is remarkably reduced, which is beneficial to improvement of the product yield. In general, the anode of the OLED display substrate is also made of a transparent electrically-conductive material, so that both of the capacitor electrodes of the storage capacitor are transparent.

Optionally, the transparent electrodes may be made of one of indium tin oxide (ITO), graphene, and MoTi. Of course, a material of the transparent electrodes is not limited to the ITO, the graphene, and the MoTi, and other transparent electrically-conductive materials having a high light transmittance and an excellent electrical conductivity may be used.

Optionally, the OLED display substrate includes an interlayer insulating layer 25 between the first capacitor electrode 24 and the second capacitor electrode 26 and a passivation layer 27 between the second capacitor electrode 26 and the third capacitor electrode 28.

Optionally, the OLED display substrate includes a gate insulating layer, a gate electrode, and a gate line between the first capacitor electrode 24 and the interlayer insulating layer 25.

Optionally, the OLED display substrate includes a source electrode, a drain electrode, and a data line in a same layer as that of the second capacitor electrode 26.

Optionally, the OLED display substrate includes a light-shielding metal layer 22 at a side of the first capacitor electrode 24 facing towards the base substrate 21, and a buffer layer 23 between the light-shielding metal layer 22 and the first capacitor electrode 24. The light-shielding metal layer 22 may be a metal such as Cu, Al, Ag, Mo, Cr, Nd, Ni, Mn, Ti, Ta, W, or an alloy of these metals. The buffer layer 23 may be an oxide, a nitride, or an oxynitride.

Some embodiments of the present disclosure also provide a display device including the OLED display substrate as described above. The display device may be any product or component having a display function such as a television, a display, a digital photo frame, a mobile phone, a tablet computer, and the like, wherein the display device further includes a flexible circuit board, a printed circuit board, and a backplate.

In the display device of this example, the light transmittance of the storage capacitor is greater than the preset threshold value, and the orthographic projection of the storage capacitor on the base substrate and the orthographic projection of the aperture region corresponding to the storage capacitor on the base substrate are designed to have the overlapping region. In this way, an area of the storage capacitor may be increased, and an area of the aperture region of a pixel may be increased, too, so that the aperture ratio of the OLED display substrate may be improved. In addition, a space occupied by the pixel is increased, a line density is remarkably decreased, and the product yield is also improved.

Some embodiments of the present disclosure also provide a method of manufacturing an OLED display substrate, the OLED display substrate including a plurality of aperture regions arranged in an array. The method including a step S1.

Step S1: manufacturing a plurality of storage capacitors on a base substrate, wherein an orthographic projection of each of the plurality of storage capacitors on the base substrate has an overlapping region with an orthographic projection of an aperture region corresponding to the storage capacitor in the plurality of aperture regions on the base substrate.

Optionally, a light transmittance of each of the plurality of storage capacitors A is greater than a preset threshold value, for example, 80% or more, such as, 90%, 95%, etc.

In this example, the storage capacitor having the light transmittance greater than the preset threshold value is manufactured on the base substrate, and the orthographic projection of the storage capacitor on the base substrate and the orthographic projection of the aperture region on the base substrate are designed to have the overlapping region. In this way, the area of the storage capacitor may be increased, and an area of the aperture region of a pixel may be increased, too, so that the aperture ratio of the OLED display substrate may be improved. In addition, since the space occupied by the pixel is increased, the line density is remarkably decreased, and the product yield is also improved.

An electrode of the storage capacitor may be made of a transparent electrically-conductive material, and the light transmittance of the storage capacitor may be more than 80% by selecting a material and a thickness of the electrode of the storage capacitor. In this way, the storage capacitor may be designed to be in the aperture region, so that the area of the aperture region of the pixel may be increased, thereby further improving the aperture ratio of the OLED display substrate.

Optionally, that the orthographic projection of each of the plurality of storage capacitors on the base substrate has an overlapping region with the orthographic projection of the aperture region corresponding to the storage capacitor in the plurality of aperture regions on the base substrate, specifically includes that the orthographic projection of each of the plurality of storage capacitors on the base substrate falls within the orthographic projection of the aperture region corresponding to the storage capacitor in the plurality of aperture regions on the base substrate.

In this way, the storage capacitor does not occupy an area other than the aperture region, so that the area of the aperture region may be maximized due to no requirement of an area used to accommodate the storage capacitor outside the aperture region.

In particular, manufacturing a storage capacitor includes follow substeps S11-S15.

S11: manufacturing a first capacitor electrode.

S12: manufacturing a first insulating layer on the first capacitor electrode.

S13: manufacturing a second capacitor electrode on the first insulating layer.

S14: manufacturing a second insulating layer on the second capacitor electrode.

S15: manufacturing a third capacitor electrode on the second insulating layer, wherein the third capacitor electrode is electrically connected to the first capacitor electrode.

The first capacitor electrode and the second capacitor electrode provide a first capacitor, the second capacitor electrode and the third capacitor electrode provide a second capacitor, and the two capacitors are electrically connected approximately in parallel, so that a capacitance value of the storage capacitor is a sum of capacitance values of the two capacitors.

Optionally, the substep S11 of manufacturing the first capacitor electrode includes manufacturing the first capacitor electrode by using an electrically-conductive active layer.

The substep S13 of manufacturing the second capacitor electrode on the first insulating layer includes manufacturing the second capacitor electrode by using a transparent electrically-conductive material.

Optionally, the substep S15 of manufacturing the third capacitor electrode on the second insulating layer includes: using an anode of the OLED display substrate as the third capacitor electrode.

In this example, the storage capacitor is formed of the transparent electrode, the electrically-conductive active layer and the anode by utilizing the characteristic of the high light transmittance of the transparent electrode, and the storage capacitor is used in the aperture region of the pixel, thereby both increasing the area of the aperture region of the pixel and increasing the area of the storage capacitor, and an capacitance of the formed storage capacitor is correspondingly increased. Meanwhile, since a pixel structure is greatly simplified, a line density is remarkably reduced, which is beneficial to improvement of the product yield. In general, the anode of the OLED display substrate is also made of a transparent electrically-conductive material, so that both of the capacitor electrodes of the storage capacitor are transparent, and the light transmittance of the storage capacitor may be ensured to be relatively high.

The method of manufacturing the display substrate of the present disclosure will be described in detail hereinafter with reference to the drawings and specific examples. The method of manufacturing the display substrate in this example includes following steps 1-9.

Step 1: providing a base substrate 21, and forming a light-shielding metal layer 22 on the base substrate 21.

The base substrate 21 may be a glass substrate or a quartz substrate. Specifically, the light-shielding metal layer 22 having a thickness of about 500 angstroms (Å) to 4000 angstroms may be deposited on the base substrate 21 by using a method of sputtering or thermal evaporation. The light-shielding metal layer 22 may be a metal such as Cu, Al, Ag, Mo, Cr, Nd, Ni, Mn, Ti, Ta, and W, or an alloy of these metals. Since an active layer of the OLED display substrate in this example is made of a metal oxide semiconductor, and a performance of the metal oxide semiconductor is easily changed after being illuminated by light, it is necessary to form the light-shielding metal layer 22 on the base substrate 21, the light-shielding metal layer 22 may shield the active layer made of the metal oxide semiconductor from being illuminated by light.

Step 2: forming a buffer layer 23 on the based substrate 21 after the step 1.

Specifically, a Plasma Enhanced Chemical Vapor Deposition (PECVD) method may be used to deposit the buffer layer 23 on the base substrate 1 after the step 1, and the buffer layer 23 may be an oxide, a nitride, or an oxynitride.

Step 3: forming an active layer 24 on the substrate 21 after the step 2.

Specifically, IGZO having a thickness of 700 angstroms may be deposited on the base substrate 21 as the active layer 24 after the step 2. A layer of photoresist may be coated on the IGZO. The photoresist may be exposed by using a mask, so that a photoresist unreserved region and a photoresist reserved region may be formed, wherein the photoresist reserved region corresponds to a region where a pattern of the active layer 24 is located, and the photoresist unreserved region corresponds to a region other than the pattern. A development process is performed to completely remove the photoresist in the photoresist unreserved region, and a thickness of the photoresist in the photoresist reserved region is kept to be unchanged. The IGZO in the photoresist unreserved region is completely etched off by using an etching process, and the remaining photoresist is stripped off to form the pattern of the active layer 24.

Step 4: forming a gate insulating layer, a gate electrode, and a gate line on the base substrate 21 after the step 3.

In particular, the Plasma Enhanced Chemical Vapor Deposition (PECVD) method may be used to deposit a gate insulating layer having a thickness of 500 to 5000 angstroms on the base substrate 21 after the step 3, and the gate insulating layer may be made of an oxide, a nitride or an oxynitride, and a corresponding reaction gas is $SiH_4$, $NH_3$, $N_2$, or $SiH_2Cl_2$, $NH_3$, $N_2$.

A gate metal layer having a thickness of about 500 to 4000 angstroms may be deposited on the gate insulating layer by sputtering or thermal evaporation, and the gate metal layer may be a metal such as Cu, Al, Ag, Mo, Cr, Nd, Ni, Mn, Ti, Ta, W, or an alloy of these metals. The gate metal layer may have a single-layer structure or a multi-layer structure such as Cu\ Mo, Ti\Cu\Ti, Mo\Al\Mo, and the like. A layer of photoresist is coated on the gate metal layer, and the photoresist may be exposed by using a mask, so that a photoresist unreserved region and a photoresist reserved region may be formed, wherein the photoresist reserved region corresponds to regions where patterns of the gate line and the gate electrode are located, and the photoresist unreserved region corresponds to a region other than the patterns. A development process is performed to completely remove the photoresist in the photoresist unreserved region, and a thickness of the photoresist in the photoresist reserved region is kept to be unchanged. The gate metal layer in the photoresist unreserved region is completely etched off by using the etching process, and the remaining photoresist is stripped off to form patterns of the gate lines and the gate electrode.

Thereafter, the gate insulating layer is dry-etched, and the active layer 24 needing an electrically-conductive process is implanted with H ions through a via hole penetrating through the gate insulating layer, so that the active layer 24 is electrically-conductive, and the electrically-conductive active layer 24 is used as the first capacitor electrode of the storage capacitor.

Step 5: forming an interlayer insulating layer 25 on the base substrate 21 after the step 4.

In particular, the Plasma Enhance Chemical Vapor Deposition method may be employed to deposit the interlayer insulating layer 25 on the base substrate 21 after the step 4. The interlayer insulating layer 25 may be an oxide, a nitride, or an oxynitride. A via-hole penetrating through the interlayer insulating layer 25 is formed by dry-etching.

Step 6: forming a transparent electrode 26 on the base substrate 21 after the step 5.

In particular, a transparent electrically-conductive layer is formed on the base substrate 21 after step 5. The transparent electrically-conductive layer may be made of ITO, graphene, MoTi or the like. A layer of photoresist is coated on the transparent electrically-conductive layer, and the photoresist is exposed by using a mask so that a photoresist unreserved region and a photoresist reserved region are formed, wherein the photoresist reserved region corresponds to a region where a pattern of the transparent electrode 26 is located, and the photoresist unreserved region corresponds to a region other than the pattern. A development process is performed so that the photoresist in the photoresist unreserved region is completely removed, and a thickness of the photoresist in the photoresist reserved region is kept to be unchanged. The transparent electrically-conductive layer in the photoresist unreserved region is completely etched off by using an etching process, and the remaining photoresist is stripped off to form a pattern of the transparent electrode 26, wherein, the transparent electrode 26 is connected to an S electrode (i.e., a point P in FIG. 2) of a T1 transistor in a pixel structure shown in FIG. 2 and is used as the second capacitor electrode of the storage capacitor.

Step 7: forming patterns of a data line, a source electrode, and a drain electrode on the base substrate 21 after the step 6.

Specifically, a source-drain metal layer having a thickness of about 2000 to 4000 angstroms may be deposited on the base substrate 21 by magnetron sputtering, thermal evaporation, or other film forming methods after the step 6, and the source-drain metal layer may be a metal such as Cu, Al, Ag, Mo, Cr, Nd, Ni, Mn, Ti, Ta, W, or an alloy of these metals. The source-drain metal layer may have a single-layer structure or a multi-layer structure such as Cu\ Mo, Ti\Cu\Ti, Mo\Al\Mo, and the like. A layer of photoresist is coated on the source-drain metal layer, and the photoresist may be exposed by using a mask, so that a photoresist unreserved region and a photoresist reserved region may be formed, wherein the photoresist reserved region corresponds to regions where patterns of a source electrode, a drain electrode, and a data line are located, and the photoresist unreserved region corresponds to a region other than the patterns. A development process is performed to completely remove the photoresist in the photoresist unreserved region, and a thickness of the photoresist in the photoresist reserved region is kept to be unchanged. The source-drain metal layer in the photoresist unreserved region is completely etched off by using the etching process, and the remaining photoresist is stripped off to form patterns of the source drain, the drain electrode, and the data line.

Step 8: forming a passivation layer 27 on the base substrate 21 after the step 7.

Specifically, a passivation layer having a thickness of 1000 to 2000 angstroms may be deposited on the base substrate 21 by magnetron sputtering, thermal evaporation, PECVD, or other film forming methods after the step 7. The passivation layer may be formed of an oxide, a nitride or an oxynitride. In particular, a material of the passivation layer may be SiNx, SiOx, or Si(ON)x. The passivation layer may also be made of $Al_2O_3$. The passivation layer may be a single-layer structure or a dual-layer structure composed of silicon nitride and silicon oxide. A reaction gas corresponding to the silicon oxide may be $SiH_4$, $N_2O$. A reaction gas corresponding to the nitride or the oxynitride may be $SiH_4$, $NH_3$, $N_2$ or $SiH_2Cl_2$, $NH_3$, $N_2$. A pattern of the passivation layer 27 including a via-hole is formed by a patterning process.

Step 9: forming an anode 28 on the base substrate 21 after the step 8.

In particular, a transparent electrically-conductive layer is formed on the base substrate 21 after the step 8. The transparent electrically-conductive layer may be ITO. A layer of photoresist may be coated on the transparent electrically-conductive layer, and the photoresist is exposed by using a mask so that a photoresist unreserved region and a photoresist reserved region of the photoresist is formed, wherein the photoresist reserved region corresponds to a region where the pattern of the anode 28 is located, and the photoresist unreserved region corresponds to a region other than the pattern. A development process is performed to completely remove the photoresist in the photoresist unreserved region, and a thickness of the photoresist in the photoresist reserved region is kept to be unchanged. The transparent electrically-conductive layer in the photoresist unreserved region is completely etched off by an etching process, and the remaining photoresist is stripped off to form a pattern of the anode 28, wherein, the anode 28 is connected to the S electrode (a node U in FIG. 2) of the T2 transistor in the pixel structure shown in FIG. 2 and is used as the third capacitor electrode of the storage capacitor.

After the above steps, the storage capacitor of the OLED display substrate is manufactured, and the structure of the storage capacitor is shown in FIG. 4, wherein the electrically-conductive active layer 24, the transparent electrode 26 and the anode 28 are used as capacitor electrodes of the storage capacitor. The storage capacitor of the present example has a high light transmittance, and thus may be designed to be in the aperture region, so that the area of the aperture region of the pixel is increased, the area of the storage capacitor is increased, and the capacitance of the formed storage capacitor is correspondingly increased.

In that above solutions, the light transmittance of the storage capacitor is great than the preset threshold value, and the orthographic projection of the storage capacitor on the base substrate and the orthographic projection of the aperture region on the base substrate are designed to have the overlap region, so that the area of the storage capacitor may be increased and the area of the aperture region of the pixel is increased, so that the aperture ratio of the OLED display substrate may be improved. In addition, since the space occupied by the pixel structure is increased, the linear density is remarkably decreased, thereby facilitating improvement of the product yield.

In the method embodiments of the present disclosure, sequence numbers of the steps are not used to define an order of the steps, and variations in the order of steps obtained by those of ordinary skills in the art without paying creative effort are also within the scope of the present disclosure.

Unless otherwise defined, technical terms or scientific terms used in the present disclosure should be of a general meaning understandable by those of ordinary skills in the art to which the present disclosure pertains. Such words as 'first', 'second' and the like used in the present disclosure are not intended to denote any order, number, or importance, but merely used to distinguish different components. Similar words such as 'including' or 'include' mean that an element or item appearing before the word covers an element or item appearing after the word and equivalents thereof, without excluding other elements or items. Similar terms such as 'connection' or 'connect' are not limited to physical or mechanical connections, but may include electrical connections, whether a direct connection or an indirect connection. Such words as 'up', 'down', 'left', 'right' and the like are used only to represent a relative positional relationship, which may also change accordingly in a case that an absolute position of a described object changes.

It will be appreciated that when an element such as a layer, a film, a region or a substrate is referred to as being located 'above' or 'below' another element, the element may be located 'directly above' or 'directly above' another element, or an intermediate element may be present.

The foregoing are optional embodiments of the present disclosure. It should be noted that several modifications and refinements may be made by those of ordinary skills in the art without departing from principles of the present disclosure. These modifications and refinements should also be considered to be within the scope of the present disclosure.

What is claimed is:

1. An Organic Light Emitting Diode (OLED) display substrate, comprising:
    a plurality of aperture regions arranged in an array on a base substrate; and
    a plurality of storage capacitors on the base substrate,
    wherein an orthographic projection of each storage capacitor of the plurality of storage capacitors on the base substrate has an overlapping region with an orthographic projection of each of the plurality of aperture regions corresponding to each of the storage capacitors in the plurality of aperture regions on the base substrate.

2. The OLED display substrate according to claim 1, wherein a light transmittance of each of the plurality of storage capacitors is greater than a preset threshold value, the orthographic projection of the each of the plurality of storage capacitors on the base substrate is within the orthographic projection of each of the aperture regions corresponding to each of the storage capacitors on the base substrate.

3. The OLED display substrate according to claim 2, wherein the storage capacitor comprises a first capacitor electrode, a first insulating layer on the first capacitor electrode, a second capacitor electrode on the first insulating layer, a second insulating layer on the second capacitor electrode, and a third capacitor electrode on the second insulating layer, and the third capacitor electrode is electrically connected to the first capacitor electrode.

4. The OLED display substrate according to claim 3, wherein,
    the first capacitor electrode is an electrically-conductive active layer;
    the second capacitor electrode is a transparent electrode;
    the third capacitor electrode is an anode of the OLED display substrate.

5. The OLED display substrate according to claim 4, wherein,
    the transparent electrode is made of one of ITO, graphene, and MoTi.

6. The OLED display substrate according to claim 3, wherein,
    the first insulating layer is an interlayer insulating layer, and the second insulating layer is a passivation layer.

7. The OLED display substrate according to claim 3, further comprising:
    a gate insulating layer, a gate electrode, and a gate line between the first capacitor electrode and the first insulating layer.

8. The OLED display substrate according to claim 3, further comprising:
    a source electrode, a drain electrode, and a data line in a same layer as the second capacitor electrode.

9. The OLED display substrate according to claim 3, further comprising:
    a light-shielding metal layer at a side of the first capacitor electrode facing towards the base substrate; and
    a buffer layer between the light-shielding metal layer and the first capacitor electrode.

10. A display device, comprising:
    the OLED display substrate according to claim 1.

11. A method of manufacturing an OLED display substrate, the OLED display substrate comprising a plurality of aperture regions arranged in an array on a base substrate, the method comprising:
    manufacturing a plurality of storage capacitors on the base substrate, an orthographic projection of each of the plurality of storage capacitors on the base substrate having an overlapping region with an orthographic projection of each of the plurality of aperture regions corresponding to each of the storage capacitors in the plurality of aperture regions on the base substrate.

12. The method of manufacturing the OLED display substrate according to claim 11, wherein manufacturing the plurality of storage capacitors on the base substrate, the orthographic projection of each of the plurality of storage capacitors on the base substrate having the overlapping region with the orthographic projection of each of the aperture regions corresponding to each of the storage capacitors in the plurality of aperture regions on the base substrate, comprises:
    manufacturing the storage capacitor on the base substrate, the storage capacitor having a light transmittance greater than a preset threshold, the orthographic projection of each of the storage capacitors on the base substrate being within the orthographic projection of each of the aperture regions on the base substrate.

13. The method of manufacturing the OLED display substrate according to claim 12, wherein manufacturing the storage capacitor on the base substrate, comprises:
    manufacturing a first capacitor electrode on the base substrate;
    manufacturing a first insulating layer on the first capacitor electrode;
    manufacturing a second capacitor electrode on the first insulating layer;
    manufacturing a second insulating layer on the second capacitor electrode;
    manufacturing a third capacitor electrode on the second insulating layer, wherein the third capacitor electrode is electrically connected to the first capacitor electrode.

14. The method of manufacturing the OLED display substrate according to claim 13, wherein,
    manufacturing the first capacitor electrode comprises manufacturing the first capacitor electrode by using an electrically-conductive active layer;
    manufacturing the second capacitor electrode comprises manufacturing the second capacitor electrode by using a transparent electrically-conductive material;

manufacturing the third capacitor electrode comprises using an anode of the OLED display substrate as the third capacitor electrode.

15. The method of manufacturing the OLED display substrate according to claim 13, wherein the transparent electrode is made of one of ITO, graphene, and MoTi.

16. The method of manufacturing the OLED display substrate according to claim 13, wherein,
manufacturing a first insulating layer on the first capacitor electrode comprises: manufacturing an interlayer insulating layer on the first capacitor electrode;
manufacturing a second insulating layer on the second capacitor electrode comprises: manufacturing a passivation layer on the second capacitor electrode.

17. The method of manufacturing the OLED display substrate according to claim 13, wherein after manufacturing the second capacitor electrode on the first insulating layer, before manufacturing the second insulating layer on the second capacitor electrode, the method further comprises:
manufacturing a source electrode, a drain electrode, and a data line in a layer where the second capacitor electrode is.

18. The method of manufacturing the OLED display substrate according to claim 13, wherein before manufacturing the first capacitor electrode on the base substrate, the method further comprises:
manufacturing a light-shielding metal layer on the base substrate; and
manufacturing a buffer layer on the light-shielding metal layer.

19. The method of manufacturing the OLED display substrate according to claim 14, wherein after manufacturing the first capacitor electrode on the base substrate, before manufacturing the first insulating layer on the first capacitor electrode, the method further comprises:
manufacturing a gate insulating layer, a gate electrode, and a gate line on the first capacitor electrode.

20. The method of manufacturing the OLED display substrate according to claim 19, wherein after manufacturing the gate insulating layer, the gate electrode, and the gate line on the first capacitor electrode, manufacturing the first capacitor electrode by using the electrically-conductive active layer, comprises:
patterning the gate insulating layer to form a via-hole penetrating through the gate insulating layer;
performing ion implantation to a portion of the active layer through the via-hole to form the electrically-conducted active layer as the first capacitor electrode, the portion of the active layer being a portion needing an electrically-conductive processing.

* * * * *